United States Patent
Zogg

(10) Patent No.: US 7,174,499 B1
(45) Date of Patent: Feb. 6, 2007

(54) SYSTEM AND METHOD FOR REAL TIME OPTIMIZATION OF ITERATIVE ERROR DETECTION AND CORRECTION ALGORITHMS

(75) Inventor: Scott J. F. Zogg, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 472 days.

(21) Appl. No.: 10/667,700

(22) Filed: Sep. 22, 2003

(51) Int. Cl.
*H03M 13/00* (2006.01)
(52) U.S. Cl. .................................. 714/786; 714/755
(58) Field of Classification Search ............. 714/786, 714/752
See application file for complete search history.

(56) References Cited

U.S. PATENT DOCUMENTS 6,182,261 B1 * 1/2001 Haller et al. ............... 714/758
6,233,709 B1 * 5/2001 Zhang et al. .............. 714/774

\* cited by examiner

*Primary Examiner*—Shelly Chase
(74) *Attorney, Agent, or Firm*—Nathan O. Jensen; Kyle Eppele

(57) ABSTRACT

A system for controlling the number of iterations to be performed by an iterative decoder. The system includes an input port configured to receive a data throughput value, a processor configured to determine an efficient number of iterations for an iterative decoder based on the data throughput value, and an output port configured to provide the efficient number of iterations based on the determination by the processor.

20 Claims, 4 Drawing Sheets

| QUEUE DEPTH | MAXIMUM ITERATIONS |
|---|---|
| 0 | 25 |
| 1 | 20 |
| 2 | 19 |
| 3 | 18 |
| 4 | 16 |
| 5 | 14 |
| 6 | 10 |
| 7 | 8 |
| 8 | 5 |
| 9 | 3 |
| 10 | 2 |

FIG. 4

SYSTEM AND METHOD FOR REAL TIME OPTIMIZATION OF ITERATIVE ERROR DETECTION AND CORRECTION ALGORITHMS

BACKGROUND OF THE INVENTION

The present invention relates generally to the field of iterative error detection and correction algorithms. More particularly, the present invention relates to a system and method for real time optimization of iterative error detection and correction (EDAC) algorithms.

Wireless communication channels are used to transmit data wirelessly from a transmitting module to a receiving module. However, during wireless transmission of data, the data that is being transmitted may become corrupted. Corruption creates errors in the data such that the data that was transmitted is not the same as the data that is received. Corruption is more likely to occur wherever the communication channel has a low signal to noise ratio, as often occurs with wireless communication.

Various algorithms have been developed to attempt to detect and correct errors that have been introduced during the transmittal of data. These algorithms are called error detection and correction (EDAC) algorithms. Error detection and correction algorithms increase the accuracy of data transmitted, but the increase in accuracy is often associated with a decrease in throughput (the amount of data that passes through the channel within any defined period). The decrease in throughput is generally caused by the processing time during error detection and correction and the addition of EDAC information to fixed size data packets, reducing the amount of "real" data in each packet.

Error detection and correction algorithms include a collection of methods to detect errors in transmitted or stored data and to correct them. The error detection and correction may be performed using any of a variety of algorithms. The simplest form of error detection is a single added parity bit or a cyclic redundancy check. However, using multiple parity bits can enable an algorithm to not only detect that an error has occurred, but also which bits have been inverted, and should therefore be re-inverted to restore the original data. In general, the more extra bits are added, the greater the chance that multiple errors will be detectable and correctable.

More sophisticated error detection and control algorithms are often implemented in a turbo code encoding and decoding system. An encoder is implemented in the transmitter and a decoder is implemented in the receiver. Turbo codes are a class of error-control coding systems that offer near optimal performance, i.e. throughput while requiring only moderate complexity. Turbo codes are generally decoded using an iterative decoding algorithm wherein a packet is iteratively decoded to increasingly reduce errors. Up to a point of diminishing returns, the greater the number of iterations allowed, the more an input packet can be corrupted and still be decoded correctly.

While error detection and correction is being performed on a first packet, additional packets may be received by the receiver. These packets are placed in a queue. While the first packet is being processed, the packets remaining in the queue are not processed or analyzed, causing a reduction in throughput (the total number of packets processed by the decoder within a given time). The number of iterations a packet is processed by the decoder can greatly affect the throughput of the wireless channel. However, the reduction in throughput is balanced against the accuracy of the error detection and correction. In other words, increasing the number of iterations increases the amount of time packets stay in the queue but also increases error detection and correction accuracy.

To prevent excessive reduction in throughput, limits have been placed on the number of iterations to be performed by the decoder. The limits are determined by balancing throughput against error detection and correction. Previously, the limits have been static values.

What is needed is a system and method for optimizing an error detection and correction algorithm to provide increased error detection and control accuracy while maintaining a high throughput rate. What is further need is such a system and method configured to increase error detection and correction accuracy when the decoder queue is close to empty and increase throughput when the decoder queue is close to full.

It would be desirable to provide a system and/or method that provides one or more of these or other advantageous features. Other features and advantages will be made apparent from the present specification. The teachings disclosed extend to those embodiments which fall within the scope of the appended claims, regardless of whether they accomplish one or more of the aforementioned needs.

SUMMARY OF THE INVENTION

One embodiment of the invention relates to a system for controlling the number of iterations to be performed by an iterative decoder. The system includes an input port configured to receive a data throughput value, a processor configured to determine an efficient number of iterations for an iterative decoder based on the data throughput value, and an output port configured to provide the efficient number of iterations based on the determination by the processor.

Another embodiment of the invention relates to a method for real-time optimization of error detection and correction algorithms. The method includes receiving a data throughput value, determining a number of iterations to be performed by an iterative decoder based on the data throughput value, and providing the number of iterations to be performed to the iterative decoder.

Another embodiment of the invention relates to a modem for a wireless communication system. The modem includes a data packet queue configured to store data packets received as input to the modem, an iterative decoder configured to decode data packets stored in the data packet queue, and a processor configured to determine a data throughput value and determine the number of iterations to be performed by the iterative decoder based on the data throughput value. The processor is further configured to control the number of iterations performed by the iterative decoder based on the determination.

Alternative examples and other exemplary embodiments relate to other features and combinations of features as may be generally recited in the claims.

BRIEF DESCRIPTION OF THE DRAWINGS

The invention will become more fully understood from the following detailed description, taken in conjunction with the accompanying drawings, wherein like reference numerals refer to like elements, in which:

FIG. 4 is a sample table is containing the number of iterations to be performed by an iterative decoder, described with reference to FIG. 2, based upon the number of packets that are stored in a packet queue, also described with reference to FIG. 2.

DETAILED DESCRIPTION OF THE PREFERRED EMBODIMENTS

Figure 1:
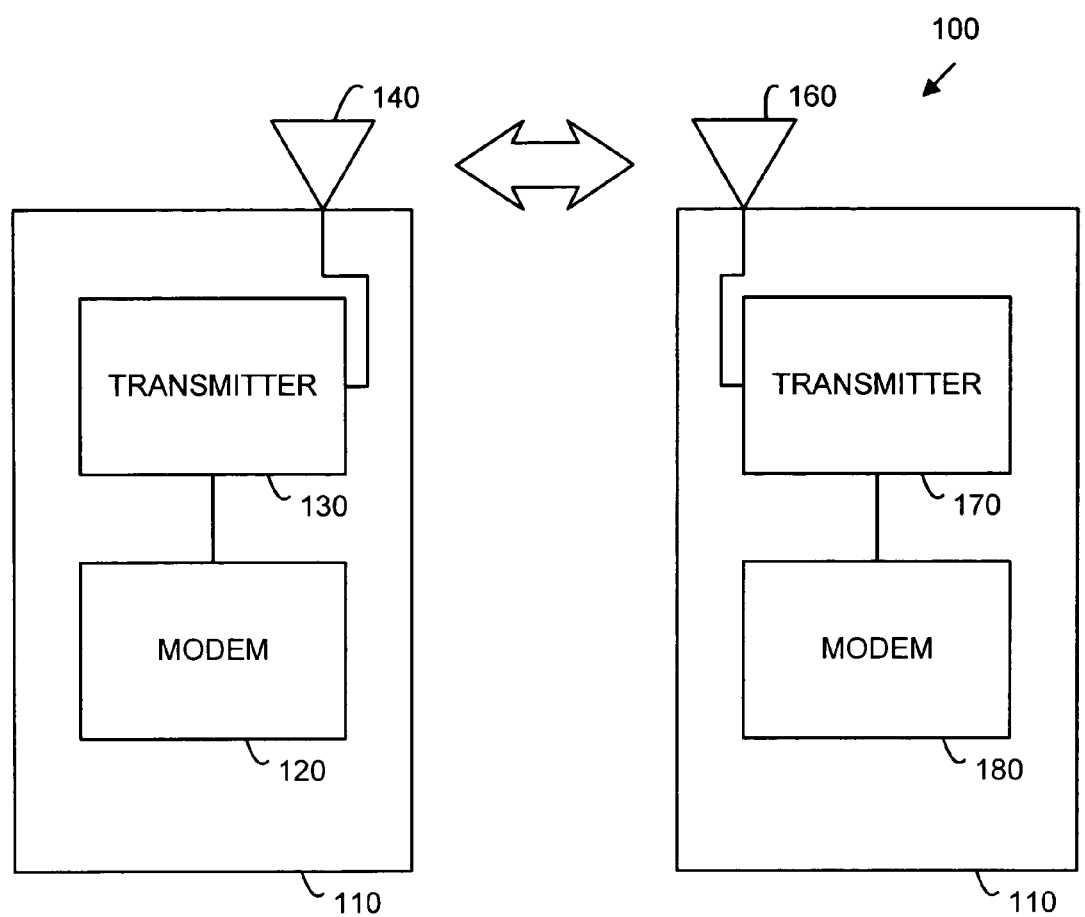
FIG. 1 is a block diagram illustrating a system for wireless communication according to an exemplary embodiment.

Before describing in detail the particular improved system and method, it should be observed that the invention includes, but is not limited to a novel structural combination of conventional data/signal processing components and communications circuits, and not in particular detailed configurations thereof. Accordingly, the structure, methods, functions, control, and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

Referring to FIG. 1, a block diagram is illustrated depicting a system 100 for wireless communication according to an exemplary embodiment. The system includes a transmitting module 110 and a receiving module 150.

Transmitting module 110 includes a transmitter modem 120, a transmitter 130, and an antenna 140. Modem 120 is any type of device for modulating digital or analog data received as input prior to transmission of the data through transmitter 130. Examples of modulating data may include compression, reformatting, encoding, encryption, implementing error correction and detection, providing networking information, etc.

Transmitter 130 is any type of transmitter configured to receive data from modem 120 and transmit the received data to receiving module 150 using antenna 140. Although transmitter 130 is described as a transmitter, according to an alternative embodiment, transmitter 130 may be a transceiver. Antenna 140 is any type of antenna for transmitting wireless data.

Receiving module 150 includes a receiving antenna 160, a receiver 170, and a receiving modem 180. Receiving antenna 160 is any type of antenna for receiving wireless data. Data received by receiver 170 is provided to receiving modem 180 and input data.

In operation, wireless data is received by transmitting modem 120 in the form of discrete packets of data or a data stream are delivered to the transmitter 130 for transmittal through antenna 140. The wireless data is received through antenna 160 at receiver 170 and provided as input to receiving modem 180.

Although the system 100 is shown in a wireless application, according to an alternative application, system 100 may be implemented as a wired system. The application described herein can be used to increase the efficiency of error detection and correction in any type of communication system.

Figure 2:
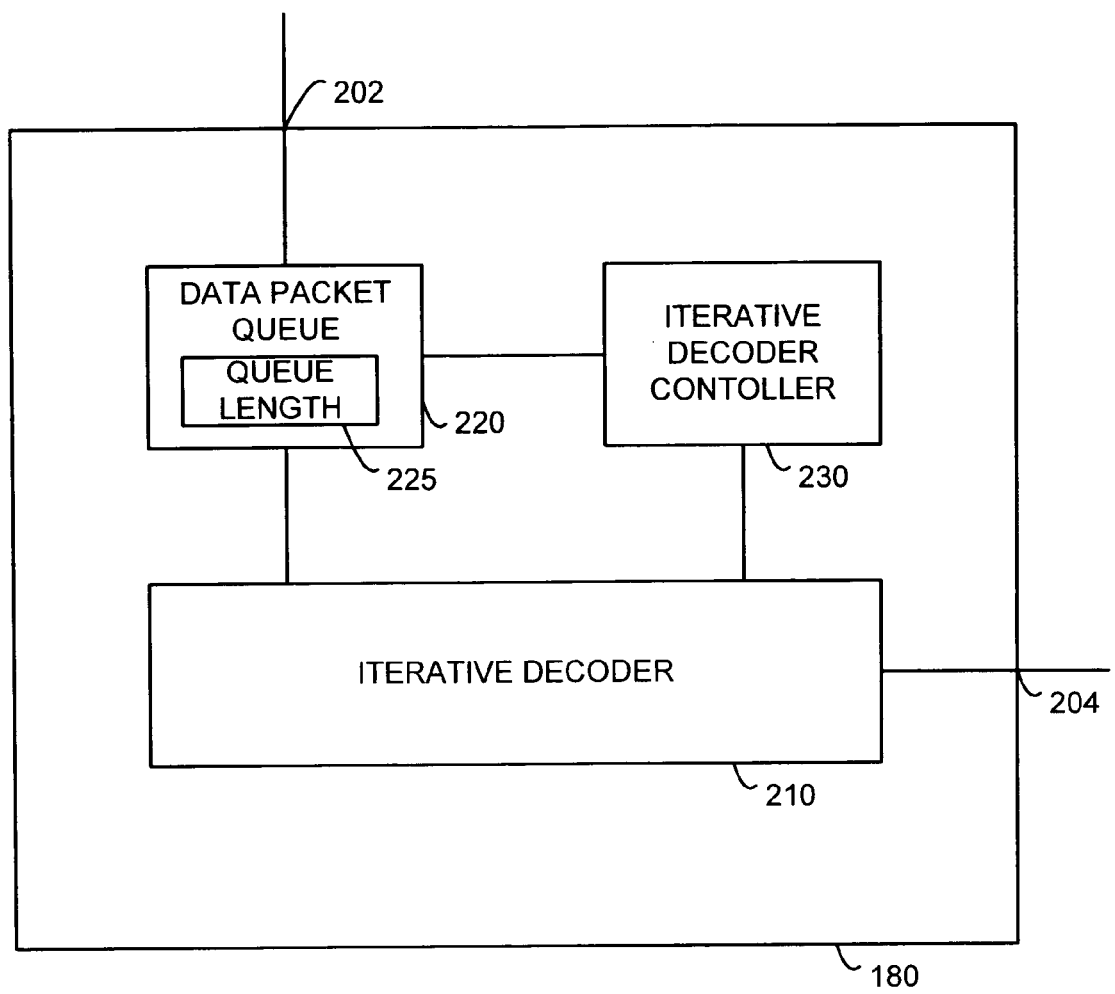
FIG. 2 is a block diagram of a receiving modem, described with reference to FIG. 1, including additional detail, according to an exemplary embodiment.

Referring to FIG. 2, FIG. 2 is a block diagram of receiving modem 180 of FIG. 1 including additional detail, according to an exemplary embodiment. Modem 180 includes an input port 202, an output port 204, iterative decoder 210, a data packet queue 220, and an iterative decoder controller 230. Generally, input port 202 receives data packets or a data stream from receiver 170. Output port 204 provide output from modem 180.

Modem 180 includes an iterative decoder 210 consisting of two (2) elementary decoders. Although two elementary decoders are described, iterative decoder 210 may include a greater or lesser number of decoders according to alternative embodiments. Preferably, the number of decoders included in iterative decoder 210 corresponds with the number of encoders included in an encoder implemented within modem 110.

According to an exemplary embodiment, iterative decoder 210 may be a turbo code decoder. A turbo code decoder is a component of an encoding and decoding system wherein both the encoder and decoder utilize interleavers to reduce the error detection and correction overhead but maintain a high level of error detection and correction.

Data packet queue 220 is a first in/first out queue configured to receive packets from receiver 170 and hold the packets in memory until receiving a packet request from iterative decoder 210. Upon receiving a packet request, the first packet received, i.e., the packet that has been in the queue for the longest time, is provided to turbo decoder 210 as input data.

According to an exemplary embodiment, data packet queue 220 is implemented with modem 180. Data packet queue 210 is implemented using modem memory (not shown) and a modem processor (not shown) associated with modem 180. The modem processor may be configured to receive a data packet and store the packet in memory along with an indication of when the packet was received. When the modem processor receives a request for a packet, the modem processor is configured to scan the modem memory to locate the packet with the earliest indication of when the packet was received, and provide that packet as input data.

Packet data queue 220 may further include a data throughput value. The data throughput value is a value representative of the amount of data currently being received and already received but not processed at receiving module 150. According to an exemplary embodiment, the data throughput value is a queue length variable 225. Queue length variable 225 is configured to contain a value equivalent the number of packets currently stored in packet data queue 220. According to the exemplary embodiment provided above where modem 180 includes a modem processor and a modem memory, the modem processor may be configured to increment queue length variable 225 whenever a packet is stored in the modem memory and decrement the queue length variable 225 whenever a packet is removed from the modem memory and provided as input data to iterative decoder 210.

Although data packet queue 220 is described herein as being implemented in modem 180 using a modem processor and modem memory, according to an alternative embodiment, packet queue 220 may be implemented external to modem 180. Further, packet queue 220 may be implemented using any alternative system or method configured to implement the packet queue functions described herein.

Iterative decoder controller 230 is a system or method for controlling the number of iterations performed by iterative decoder 210 based on queue length variable 225, further described below with reference to FIG. 3. Controller 230 may be implemented using software, such as a computer program executed by the modem processor. Alternatively, controller 230 may be implemented using hardware, such as within a field programmable gate array (FPGA) or a digital application specific integrated circuit (ASIC), or using firmware.

The components of modem 180 described herein are used to implement the system and method for real time optimization of the error detection and correction algorithm, further described below with reference to FIG. 3. Modem 180 may also contain additional components and/or different configurations of the components to implement the method. For example, there could be an additional block to measure data throughput based upon the rate at which packets are put into the queue Additionally, systems and/or components described as being within modem 180 may be implemented externally to modem 180 and perform the same function.

Figure 3:
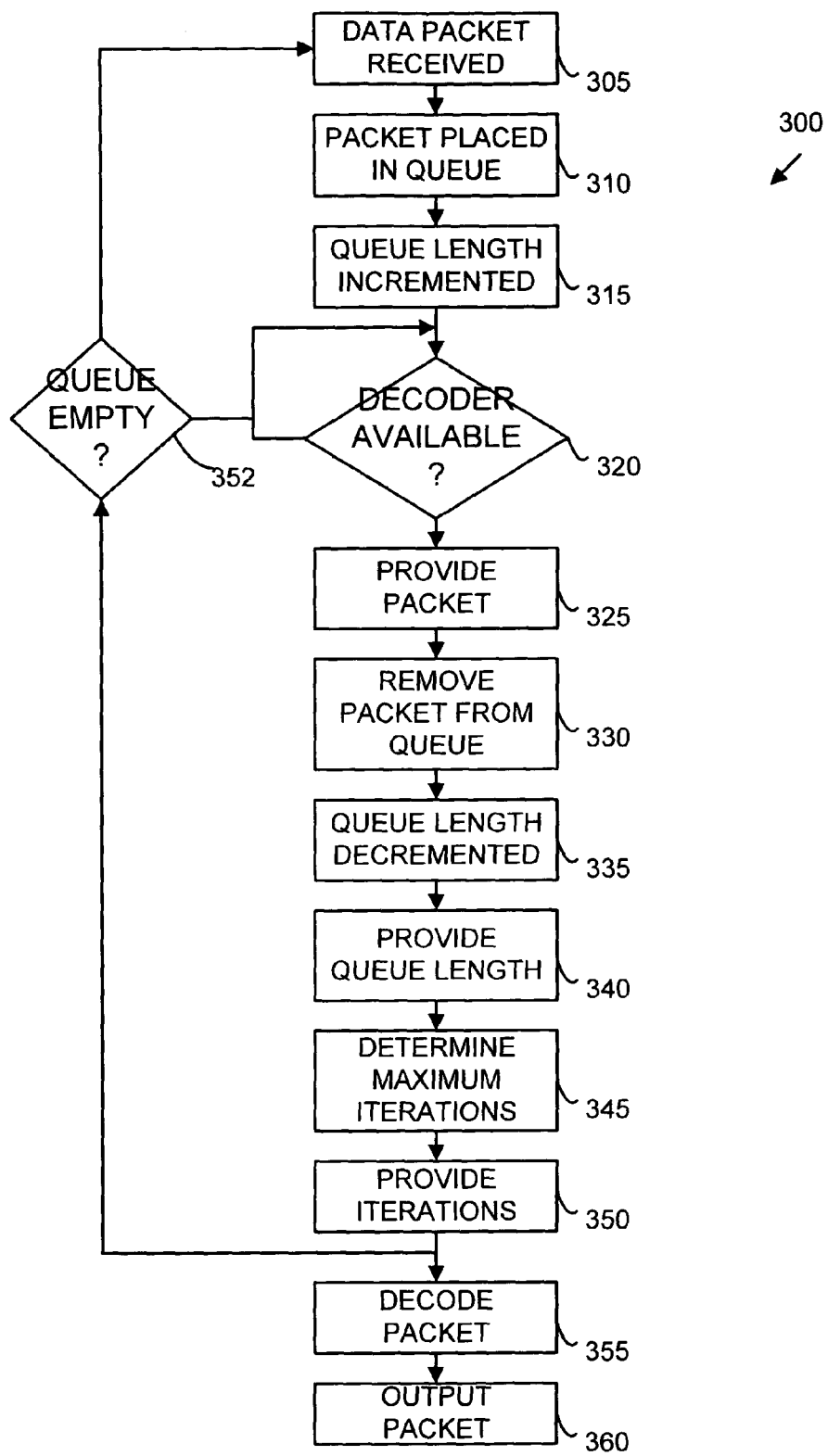
FIG. 3 is a flowchart illustrating a method for controlling the number of iterations performed by an iterative controller based upon an input, according to an exemplary embodiment.

Referring now FIG. 3, a flowchart 300 is shown illustrating a method for controlling the number of iterations performed by an iterative controller based upon an input, according to an exemplary embodiment. The method may be implemented by a modem processor according to an exemplary embodiment. According to alternative embodiments, the method may be implemented by multiple individual processors or a hardware state machine.

In a step 305, a data packet is received as input to modem 170. The data packet is stored in packet queue 220 in step 310. The data packet is placed in a list wherein the first packet in the list was the first packet to be received, the second packet is the second to be received, the third is the third packet to be received, etc. When the first packet is removed from packet queue 220, the second packet is placed in the first position, the third packet in the second etc. Alternatively, the data packet may be associated with a received time indicative of when the packet was placed in the queue.

Following storage of the data packet in packet queue 220, queue length variable 225 is incremented to reflect the addition of a packet to the packet queue in a step 315.

Following step 315, a determination is made in a step 320 whether decoder 210 is available to decode the first packet in data packet queue 220. If the packet is not available, step 305 can be repeated to continue receiving and storing packets. If decoder 210 is available to decode the packet, the first packet is provided to decoder 210. The first packet is the data packet that has been in packet queue 220 for the longest amount of time. Alternatively, the fist packet could be chosen based upon a different criteria, such as priority, signal strength, etc.

Additionally, the packet that was provided to iterative decoder 210 is removed from packet queue 220 in a step 330. Upon removing a packet from packet queue 220, queue length variable 225 is decremented to reflect the removal of a packet in a step 335. Accordingly, packet queue 225 will always contain a value representing the number of data packets in packet queue 220.

After a packet is provided to iterative decoder 210, as described above with reference to steps 325–335, the value contained in the queue length variable 225 representing the number of packets in the packet queue can be provided to controller 230 in a step 340. Controller 230 receives the value indicative of the number of packets and references a table to determine the maximum number of iterations that should be performed by turbo decoder 210 based on the number of packets in packet queue 220 in a step 345. A sample table 400 is provided and described below with reference to FIG. 4. Alternatively, instead of referencing a table, controller 230 may determine the appropriate number of iterations based upon a calculation, a dynamic table modified by historic values, or any other method.

Referring now to FIG. 4, a sample table 400 is illustrated containing the number of iterations to be performed by iterative decoder 210 based upon the number of packets that are stored in packet queue 220. A first column 410 contains values representing the depth of packet queue 220 and a second column 420 contains values representing the number of iterations to be performed by iterative decoder 210 based upon the values in first column 410. Table 400 may be a fixed table or a dynamic table that may be modified by user preferences, calculations, historical usage, etc. Additionally, table 400 may be application specific such that the values in table 400 will change based on the current application of wireless communication system 100. For example, wherein an application requires error free transmission, table 400 may generally include a higher number of maximum iterations for every Referring again to FIG. 3, following determination by controller 230 of the maximum number of iterations to be performed by iterative decoder 210, this value can be provided to iterative decoder 210 in a step 350. Following delivery, a determination is made in a step 352 whether the packet queue is empty. If packet queue 220 is empty, step 305 can be repeated. If queue 220 is not empty, step 320 can be repeated to determine when decoder 210 has completed processing of the first data packet and is ready to receive a the next data packet. Upon delivery, iterative decoder 210 will decode the received packet for up to the number of iterations designated by controller 230 in a step 355. After decoding, the decoded packet is provided as output in a step 360.

According to an alternative embodiment, controller 230 may be implemented within iterative decoder 210. According to this alternative embodiment, the value stored in queue length variable 225 is provided with the packet. Accordingly, whenever iterative decoder 210 begins processing a new packet, decoder 210 also receives the number of packets currently stored in packet queue 225 and is able to determine the number of iterations to perform.

According to yet another alternative embodiment, the queue length value 225 representing number of packets stored in data queue 220 may be received by iterative decoder 210 following each iteration. Accordingly, the number of times a particular packet is decoded may be a dynamic value.

In general, the maximum number of iteration performed using the method increases while the number of data packets stored in data packet queue 220 is low and decreases while the number of data packets stored in data packet queue 220 is high. Advantageously, using the method described above provides a balance between high error detection and correction and high throughput.

According to an alternative embodiment, the data throughput value may be an alternative value instead of or in addition to the number of packets in packet queue 220. For example, the alternative value may be representative of the rate at which packets are being received in the packet queue. Advantageously, analyzing the rate at which packets are being received allows the user the determine that, although the packet queue may currently be low, packets are being received at such a high rate that the packet will soon be full unless the number of iterations performed by iterative decoder 220 is decreased.

While the detailed drawings, specific examples and particular formulations given describe preferred and exemplary embodiments, they serve the purpose of illustration only. The inventions disclosed are not limited to the specific forms shown. For example, the methods may be performed in any of a variety of sequence of steps. The hardware and software configurations shown and described may differ depending on the chosen performance characteristics and physical characteristics of the computing devices. For example, the type of receiver, iterative decoder, or processor used may differ. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A system for controlling the number of iterations to be performed by an iterative decoder, comprising:
    an input port configured to receive a data throughput value;
    a processor configured to determine an efficient number of iterations for an iterative decoder based on the data throughput value; and
    an output port configured to provide the efficient number of iterations based on the determination by the processor.

2. The system of claim 1, wherein the data throughput value is the number of packets that are currently stored in a data packet queue.

3. The system of claim 2, wherein the determination by the processor is made by referencing a table.

4. The system of claim 3, wherein the table includes a number of iterations to be performed by the iterative decoder for each possible length of the packet data queue.

5. The system of claim 1, wherein the data throughput value is the rate at which data packets are being received by a receiving module include the system for controlling the number of iterations to be performed by an iterative decoder.

6. The system of claim 1, wherein the processor is further configured to calculate a number of iterations to be performed by the iterative decoder using the data throughput value as an input value.

7. A method for real-time optimization of error detection and correction algorithms, comprising:
    receiving a data throughput value;
    determining a number of iterations to be performed by an iterative decoder based on the data throughput value; and
    providing the number of iterations to be performed to the iterative decoder.

8. The method of claim 7, wherein the data throughput value is the number of packets that are currently stored in a data packet queue.

9. The method of claim 7, wherein the data throughput value is the rate at which data packets are being received by a receiving module.

10. The method of claim 7, wherein determining a number of iteration to be performed includes referencing a table.

11. The method of claim 10, wherein the table includes a number of iterations to be performed by the iterative decoder for each possible length of the packet data queue.

12. The method of claim 7, wherein the determination by the processor is made based on a calculation using the data throughput value as an input value.

13. A modem for a wireless communication system, comprising:
    a data packet queue configured to store data packets received as input to the modem;
    an iterative decoder configured to decode data packets stored in the data packet queue; and
    a processor configured to determine a data throughput value and determine the number of iterations to be performed by the iterative decoder based on the data throughput value and further configured to control the number of iterations performed by the iterative decoder based on the determination.

14. The modem of claim 13, wherein the processor is configured to determine the number of iterations to be performed each time before the iterative decoder begins to decode a packet.

15. The modem of claim 13, wherein the processor is configured to determine the number of iterations to be performed each time before the iterative decoder begins an iteration while decoding a packet.

16. The system of claim 13, wherein the data throughput value is the number of packets that are currently stored in a data packet queue.

17. The modem of claim 13, wherein the data throughput value is the rate at which data packets are being received by a receiving module include the system for controlling the number of iterations to be performed by an iterative decoder.

18. The modem of claim 13, wherein the determination by the processor is made by referencing a table.

19. The method of claim 18, wherein the table includes a number of iterations to be performed by the iterative decoder for each possible length of the packet data queue.

20. The modem of claim 13, wherein the determination by the processor is made based on a calculation using the data throughput value as an input value.

* * * * *